(12) United States Patent
You et al.

(10) Patent No.: US 11,637,186 B2
(45) Date of Patent: Apr. 25, 2023

(54) FIELD EFFECT TRANSISTOR HAVING GATE CONTACT AND SOURCE/DRAIN CONTACT SEPARATED BY A GAP

(71) Applicant: Taiwan Semiconductor Manufacturing Co., Ltd., Hsinchu (TW)

(72) Inventors: Jia-Chuan You, Taoyuan County (TW); Chia-Hao Chang, Hsinchu (TW); Tien-Lu Lin, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/406,154

(22) Filed: May 8, 2019

(65) Prior Publication Data

US 2020/0161439 A1 May 21, 2020

Related U.S. Application Data

(60) Provisional application No. 62/769,922, filed on Nov. 20, 2018.

(51) Int. Cl.
*H01L 29/78* (2006.01)
*H01L 29/417* (2006.01)
*H01L 29/66* (2006.01)

(52) U.S. Cl.
CPC .. *H01L 29/41791* (2013.01); *H01L 29/66795* (2013.01); *H01L 29/785* (2013.01); *H01L 2029/7858* (2013.01)

(58) Field of Classification Search
CPC ............. H01L 29/0653; H01L 29/4991; H01L 2221/1042; H01L 29/41791; H01L 29/66795; H01L 29/7858
See application file for complete search history.

(56) References Cited

U.S. PATENT DOCUMENTS

| | | | |
|---|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Anh D Mai
(74) *Attorney, Agent, or Firm* — Haynes and Boone, LLP

(57) ABSTRACT

Semiconductor devices and methods of forming the same are provided. In one embodiment, a semiconductor device according to the present disclosure includes a fin extending from a substrate, a gate structure over a channel region of the fin, a source/drain contact over a source/drain region of the fin, a gate cut feature adjacent the gate structure, a source/drain contact isolation feature adjacent the source/drain contact, a spacer extending along a sidewall of the gate cut feature and a sidewall of the gate structure, a liner extending along a sidewall of the source/drain contact isolation feature and a sidewall of the source/drain contact; and an air gap sandwiched between the spacer and the liner. The gate cut feature and the source/drain contact isolation feature are separated by the spacer, the air gap and the liner.

17 Claims, 11 Drawing Sheets

(56) References Cited

U.S. PATENT DOCUMENTS

| | | | |
|---|---|---|---|
| 9,368,460 B2 | 6/2016 | Yu et al. | |
| 9,372,206 B2 | 6/2016 | Wu et al. | |
| 9,496,189 B2 | 11/2016 | Yu et al. | |
| 10,283,600 B2 * | 5/2019 | Lee | H01L 29/4991 |
| 10,734,280 B2 * | 8/2020 | Yim | H01L 29/66545 |
| 2015/0041918 A1 * | 2/2015 | Wann | H01L 27/0886 |
| | | | 438/283 |
| 2016/0365426 A1 * | 12/2016 | Ching | H01L 29/66795 |

* cited by examiner

FIELD EFFECT TRANSISTOR HAVING GATE CONTACT AND SOURCE/DRAIN CONTACT SEPARATED BY A GAP

PRIORITY DATA

This application claims the benefit of U.S. Provisional Application No. 62/769,922, filed Nov. 20, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, even with the introduction of FinFETs, aggressive scaling down of IC dimensions has resulted in increased parasitic capacitance (e.g., between a FinFET gate and source/drain regions or source/drain contacts). As a result of such increased parasitic capacitance, device performance is degraded. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
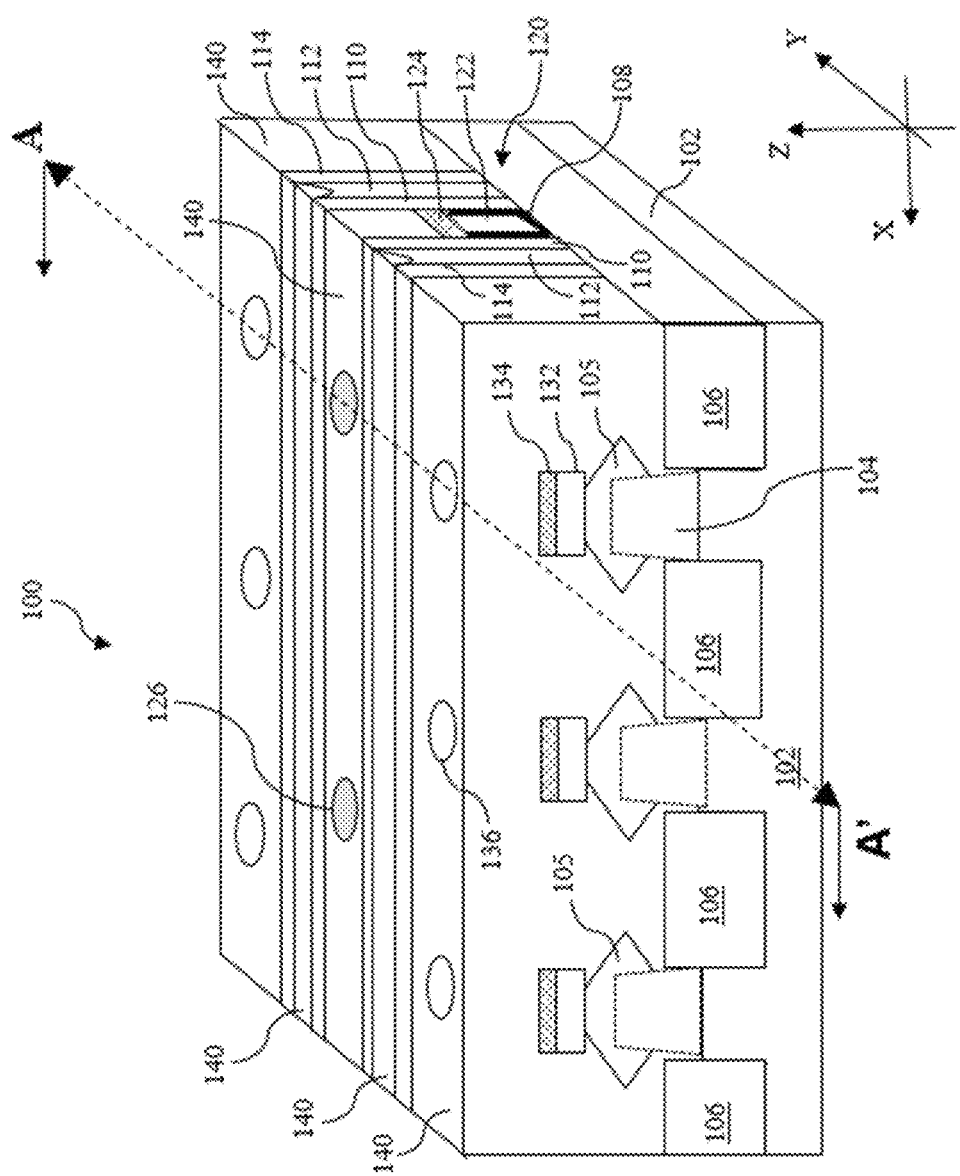
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

This application relates to semiconductor device structures and methods of forming the same, particularly high-speed semiconductor device structures and methods. A semiconductor device structure of the present disclosure includes air gaps on both sides of a gate structure, both sides of a source/drain contact, both sides of an gate contact via overlying the gate structure, and both sides of a source/drain contact via overlying the source/drain contact to reduce parasitic capacitance and increase speed of the semiconductor device. A semiconductor structure according embodiments of the present disclosure may include a fin extending from a surface of a substrate. The fin may include a channel region and source/drain regions adjacent the channel region. The semiconductor structure may include a gate structure extending over the channel region and a source/drain contact over the source/drain region. The semiconductor structure may also include a gate contact via over and electrically coupled to the gate structure and a source/drain contact via over and electrically coupled to the source/drain contact. The gate structure and the gate contact via are laterally sandwiched between spacers extending along sidewalls of the gate structure. The source/drain contact and the source/drain contact via are laterally sandwiched between liners extending along sidewalls of the source/drain contact. A spacer and an adjacent liner is separated by an air gap extending vertically from a bottom of the gate structure to near a top surface of the gate contact via or a top surface of the source/drain contact via. These vertically extending air gaps serve as extremely low-k spacers that reduce parasitic capacitance formed among conductive features (such as the gate structures, source/drain contacts, gate contact vias and source/drain contact vias) and increase the speed of the semiconductor device.

Illustrated in FIG. 1 is a FinFET device 100. The FinFET device 100 includes one or more fin-based, multi-gate field-effect transistors (FETs). While the embodiments of the present disclosure are described using the FinFET device 100 in FIG. 1 as an example, the present disclosure is not so limited and may be applicable to other type of FETs that include semiconductor features other than the fin-elements shown in figures of the present disclosure. The FinFET device 100 includes a substrate 102, at least one fin-element 104 extending from the substrate 102, isolation regions 106, and a gate structure 120 disposed on and around the fin-element 104. The substrate 102 may be a semiconductor substrate such as a silicon substrate. The substrate may include various layers, including conductive or insulating layers formed on a semiconductor substrate. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include an SOI structure, and/or the substrate 102 may have other suitable enhancement features.

The fin-element 104 (or fin 104), like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate 102 (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 102 while an etch process forms recesses into the substrate 102, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source/drain region 105 where the source/drain region 105 is formed in, on, adjacent and/or surrounding the fin 104. It is noted that in a FET, such as the FinFET device 100, a channel region is sandwiched between a source region and a drain region. For ease of reference and description, the source region and the drain region on different sides of a channel region is referred generally as the source/drain region, represented by the source/drain region 105 shown in FIG. 1. The source/drain regions 105 may be epitaxially grown over the fins 104. A channel region of a transistor is disposed within the fin 104, underlying the gate structure 120, along a plane substantially parallel to a plane defined by section A-A' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2$/V-s and a hole mobility of around 480 $cm^2$/V-s, in some instances.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure.

The gate structure 120 includes a gate stack including a gate dielectric layer 108, and a metal layer 122 formed over the gate dielectric layer 108. In some embodiments, the gate dielectric layer 108 may include an interfacial layer formed over the channel region of the fin 104 and a high-K dielectric layer over the interfacial layer. The interfacial layer of the gate dielectric layer 108 may include a dielectric material such as silicon oxide layer ($SiO_2$) or silicon oxynitride (SiON). The high-K dielectric layer of the gate dielectric layer 108 may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer 108 may include silicon dioxide or another suitable dielectric. The gate dielectric layer 108 may be formed by chemical oxidation, thermal oxidation, atomic layer deposition (ALD), physical vapor deposition (PVD), chemical vapor deposition (CVD), and/or other suitable methods. The metal layer 122 may include a conductive layer such as W, TiN, TaN, WN, Re, Ir, Ru, Mo, Al, Cu, Co, Ni, combinations thereof, and/or other suitable compositions. In some embodiments, the metal layer 122 may include a first group of metal materials for N-type FinFETs and a second group of metal materials for P-type FinFETs. Thus, the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 122 may provide a gate electrode for the FinFET device 100, including both N-type and P-type FinFET devices 100. In some embodiments, the metal layer 122 may alternately include a polysilicon layer. The metal layer 122 may be formed using PVD, CVD, electron beam (e-beam) evaporation, and/or other suitable process.

In some embodiments, a replacement gate process (or gate replacement process) may be used to form the gate structure 120. In a replacement gate process, a sacrificial gate structure or a dummy gate is first formed of a semiconductor material, such as polysilicon, over the channel region to serve as a placeholder for the final gate structure is to be formed. After features around the dummy gate are fabricated, the dummy gate will be removed and replaced with the final gate structure. When the replacement gate process is used, multiple spacers (or spacer layers) may be formed over the dummy gate. Spacers formed on the top surface of the dummy gate structure may be removed at a later stage to allow excess access to and removal of the dummy gate structure. In some embodiments represented in FIG. 1, two spacers—the first spacer 110 and the second spacer (not shown, removed in FIG. 1) are formed over the dummy gate. A liner may be formed over the sidewall of the second spacer. After the dummy gate is removed and replaced by the gate structure 120, these two spacers and the liner may remain along the sidewalls of the gate structure 120. The spacers and the liner may include a dielectric material such as silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or combination thereof. In some embodiments, the second spacer is removed, leaving an air gap 112 between the first spacer 110 and the liner 114. The air gap 112 in FIG. 1 is plugged from the top by the first sealing layer 140.

In some embodiments, to prevent the metal layer 122 from being etched or oxidized in later processes, a gate cap layer 124 may be formed over the metal layer 122. The gate cap layer 124 may be formed of tungsten, cobalt, nickel, ruthenium, titanium, titanium nitride, tantalum, tantalum nitride. In some implementations, a gate dielectric cap may be formed over the gate cap layer 124. In FIG. 1, the gate dielectric cap has been removed after the formation of the gate contact via 126 through the gate dielectric cap and replaced with a first sealing layer 140. In the embodiments represented in FIG. 1, the gate contact via 126 extends vertically through the first sealing layer 140 and is electrically coupled to metal layer 122 via the cap layer 124. The metal layer 122 may be referred to as the gate structure.

The FinFET device 100 may include a source/drain contact 132 electrically coupled to the source/drain region 105. To electrically couple the source/drain contact 132 to the source/drain region 105, the source/drain region 105 may be recessed and a silicide layer may be formed between the recessed source/drain region 105 and the source/drain contact 132. In some implementations, an etch stop layer may be formed over the source/drain region 105 before the source/drain region 105 is recessed. Then a silicide precursor, such as nickel, cobalt and titanium, is deposited over the recessed source/drain region 105. A silicide feature, such as nickel silicide, cobalt silicide or titanium silicide may be formed over the recessed source/drain region 105 after annealing. The silicide feature may reduce the contact resistance between the source/drain region 105 and the source/drain contact 132. Similar to the metal layer 122, a source/drain cap layer 134 may be formed over the source/drain contact 132. The source/drain cap layer 134 may be formed of tungsten, cobalt, nickel, ruthenium, titanium, titanium nitride, tantalum, tantalum nitride. Thereafter, a source/drain contact via 136 may be formed over the source/drain cap layer 134 for routing through a metal line in a metal layer or an interconnect structure. Although not shown in FIG. 1, the silicide feature, the source/drain contact 132, the source/drain cap layer 134, and the source/drain contact via 136 may be formed over the source/drain region 105 while the source/drain region 105 is generally covered by a dielectric layer. In FIG. 1, the dielectric layer is not shown because it has been removed along with the second spacer layer and replaced with the first sealing layer 140.

As noted above, aggressive scaling down of IC dimensions has resulted in increased parasitic capacitance (e.g., between a FinFET gate and source/drain regions or source/drain contacts, or between), thus degrading device performance. In particular, the parasitic capacitance contribution of sidewall spacers has become a greater portion of the total parasitic capacitance of a FinFET device. To address this issue, air gaps or air gap sidewall spacers have been introduced, for example, as a replacement to one of more of the dielectric materials used in conventional sidewall spacers (e.g., such as formed on sidewalls of the gate structure 120). In various embodiments, air gaps provide a lower dielectric constant than the dielectric materials used in conventional sidewall spacers. Thus, devices that employ air gaps generally have reduced parasitic capacitance and improved performance. However, such air gaps end around a top surface of the gate structure and are not similarly introduced between gate contact vias and source/drain contact vias. As a result, gate contact vias and source/drain contact vias are either made slim or are intentionally spaced apart from one another to ensure sufficient dielectric material between them. By doing that, current flow through contact vias may be restricted and freedom for routing design may be limited.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for providing an air gap (e.g., protected by multiple layers of seal materials) that provides a reduced spacer dielectric constant and enhanced device performance. In particular, embodiments disclosed herein provide for the formation of air gaps that not only separate gate structures from source/drain contacts, but also separate gate contact vias from source/drain contact vias, along a direction parallel to a top surface (or primary surface) of the substrate.

Figure 2:
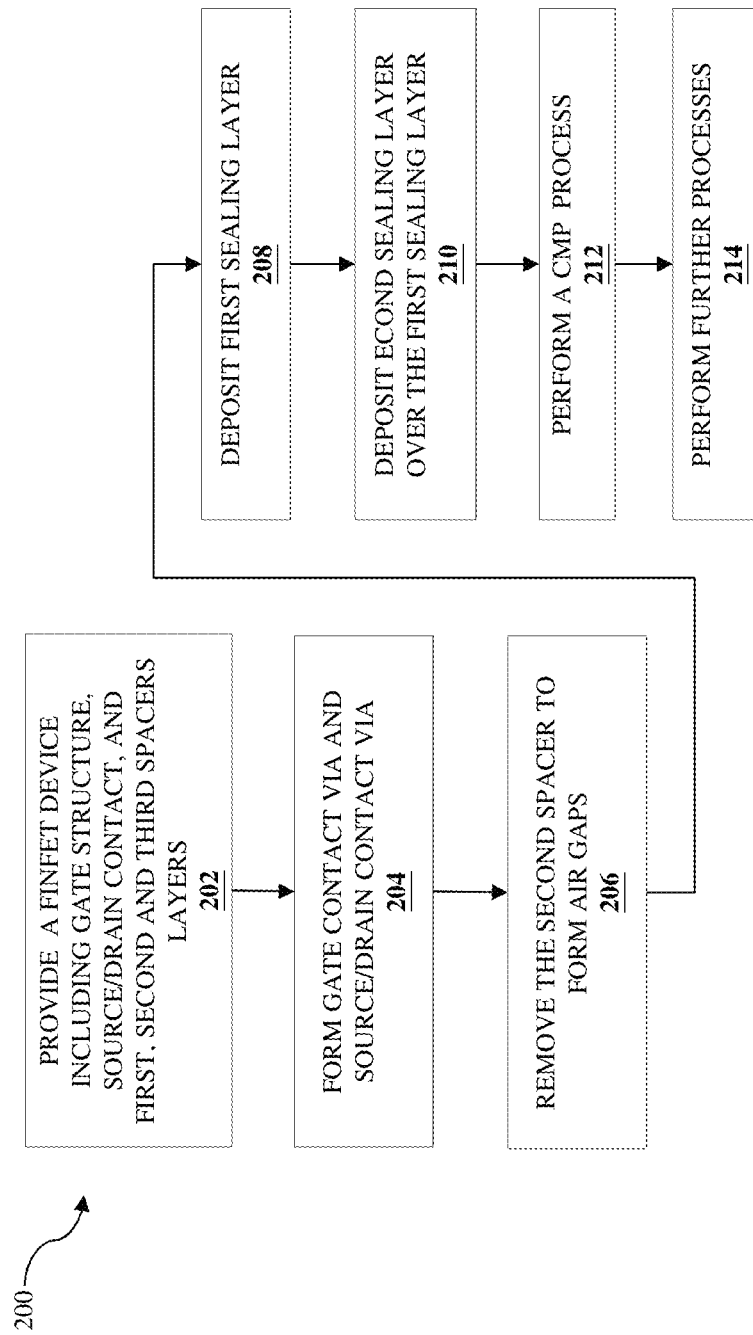
FIG. 2 is a flow chart of a method of fabricating a semiconductor device including an air gap sidewall spacer, in accordance with some embodiments.

Referring now to FIG. 2, illustrated is a method 200 of fabricating a semiconductor device 300 (e.g., such as a FinFET device, also referred to as device 300) including an air gap, in accordance with one or more embodiments. In some embodiments, the method 200 may be used to fabricate the FinFET device 100, described above with reference to FIG. 1. Thus, one or more aspects discussed above with reference to the FinFET device 100 may also apply to the method 200. Additionally, FIGS. 3-8 provide cross-sectional views, along a plane substantially parallel to a plane defined by section A-A' of FIG. 1, of an exemplary device 300 fabricated according to one or more steps of the method 200 of FIG. 2. It is noted, while FIG. 1 and FIG. 3 may include different device features and aspects, they may nevertheless be snapshots of a single semiconductor device.

It is understood that parts of the method 200 and/or the semiconductor device 300 may be fabricated by a well-known CMOS technology process flow, and thus some processes are only briefly described herein. In addition, as described above, the device 300 may share aspects of the device 100, thus some aspects and/or processes of the device 300 are only discussed briefly for purposes of clarity in understanding. Further, the semiconductor device 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 300 includes a plurality of semiconductor devices (e.g., transistors), which may be interconnected.

In various embodiments, the device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), high voltage transistors, high frequency transistors, other memory cells, and/or combinations thereof.

Figure 3:
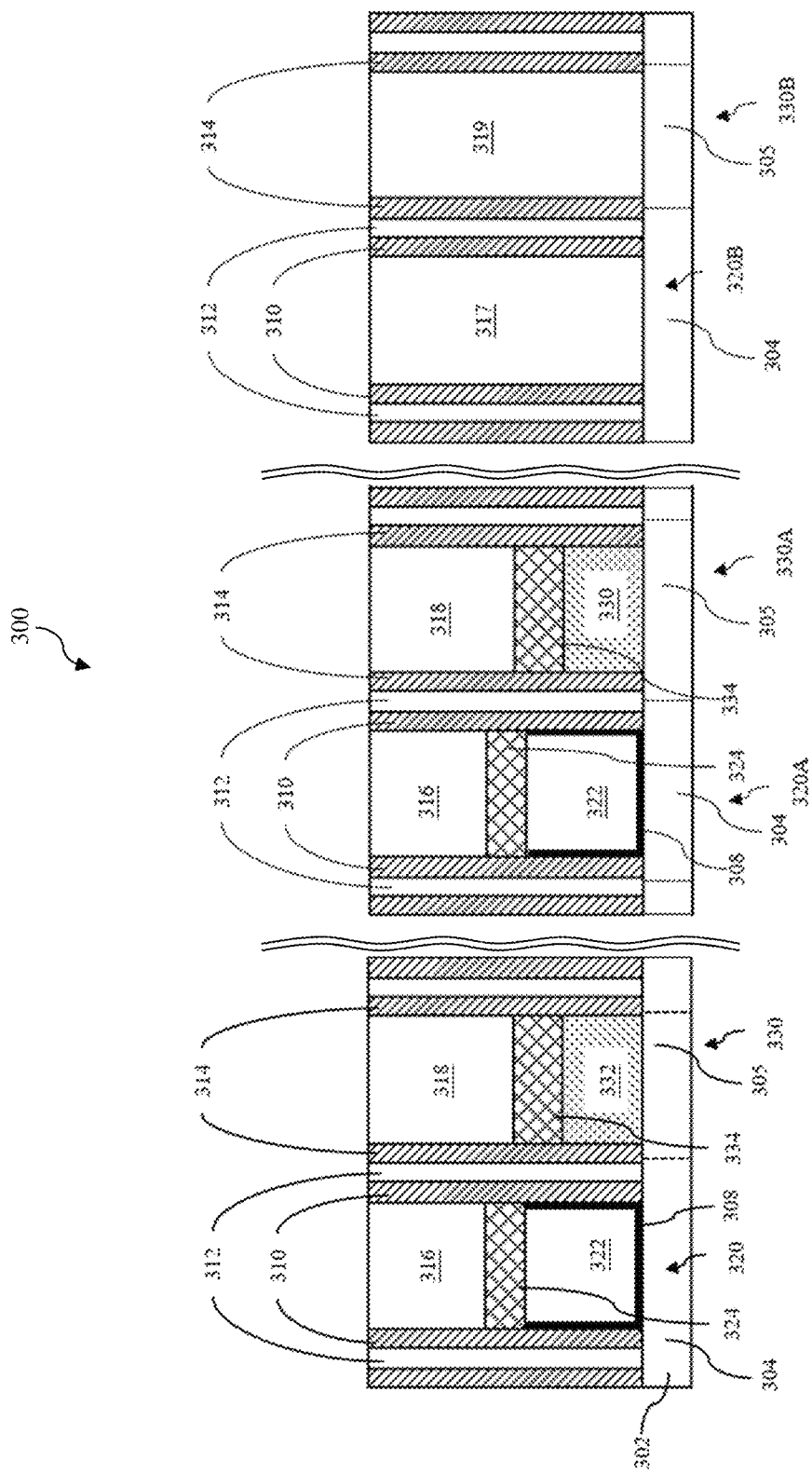
FIGS. 3-8 provide cross-sectional views along a plane substantially parallel to a plane defined by section A-A' of FIG. 1, of an exemplary device fabricated according to one or more steps of the method of FIG. 2.

Referring now to the method 200, the method 200 begins at block 202 where a FinFET device 300 is provided. While being fabricated, the FinFET device 300 may be referred to as a workpiece from time to time herein. In that sense, a workpiece having the FinFET device 300 thereon is received at block 202. The FinFET device 300 may include a gate structure 320, a source/drain contact 332, and at least two spacers formed along a sidewall of the gate structure 320. Referring to FIG. 3, illustrated therein is a FinFET device 300 including a fin 302 that extends from a substrate. The fin 302 includes channel regions 304 and source/drain region 305 adjacent to the channel region 304. The FinFET device 300 also includes the gate structure 320 that includes a gate dielectric layer 308, and a metal layer 322 over the gate dielectric layer 308. In some embodiments, the substrate, the fin 302, the gate dielectric layer 308, and the metal layer 322 may be substantially similar to the substrate 102, the fin-elements 104, the gate dielectric layer 108, and the metal layer 122 discussed above with reference to FIG. 1. In some examples, the metal layer 322 has a height of around 30-40 nm. In some implementations, the FinFET device 300 may also include a gate cap layer 324 disposed over the metal layer 322 and a first dielectric layer 316 over the gate cap layer 324. In some instances, the first dielectric layer 316 may be referred to as a first self-aligned contact (SAC) dielectric or SAC1 layer. In the embodiments represented in FIG. 3, the FinFET device 300 includes two spacers—the first spacer 310 and the second spacer 312. In some embodiments, each of the first spacer 310 and the second spacer 312 may be formed to a width between about 5 nm and about 10 nm. As described above, because spacers are formed by depositing spacer material over a dummy gate, followed by removal of the dummy gate, a gate spacer would be illustrated on both sides of the gate structure 320. In some embodiments, the metal layer 322 may be formed of a conductive layer such as W, TiN, TaN, WN, Re, Ir, Ru, Mo, Al, Cu, Co, Ni, combinations thereof, and/or other suitable compositions.

In some embodiments, the source/drain region 305 of the device 300 includes epitaxial source/drain features which may be formed by one or more epitaxial processes. In some cases, the epitaxial source/drain features may be formed in, on, and/or surrounding the fin 302 in the source/drain region 305. It is noted that for ease of illustration, the fin 302 is illustrated in FIGS. 3-8 as being flat along the Y direction. In some instance, the profile of the fin 302 along line A-A' may not be flat due to various reasons, including, for example, the presence of the source/drain features and recess of the source/drain features. A liner 314 may be formed over the source/drain region 305 and sidewalls of the second spacers 312. In various examples, after liner material over top surface of the epitaxial source/drain features are removed, a silicide layer may be formed over the epitaxial source/drain features to reduce contact resistance. In some embodiments, the silicide layer may include Co silicide, Ni silicide, or Ti silicide. Further, in some embodiments, a source/drain contact 332 may be formed over the silicide layer to provide electrical contact to the epitaxial source/drain features. In at least some examples, the source/drain contact 332 includes a Co layer, although other suitable metals may be used without departing from the scope of the present disclosure. In some embodiments represented in FIG. 3, the gate structure 320 is sandwiched between two first spacers 310, which are further sandwiched between two second spacers 312 from both sides of the gate structure 320 along the Y direction. The source/drain contact 332 is sandwiched between two liners 314. In these embodiments, the second spacer 312 is interposed between the first spacer 310 and the liner 314. As illustrated in FIG. 3, a source/drain cap layer 334 may be formed over the source/drain contact 332 and a second dielectric layer 318 (or a second SAC dielectric layer 318 or SAC2) may be formed over the source/drain cap layer 334. The workpiece for the FinFET device 300 in FIG. 3 is planarized using chemical mechanical polishing (CMP) or other suitable grinding techniques.

In some embodiments, the gate cap layer 324 and the source/drain cap layer 334 may be formed of the same material or different materials. For example, the gate cap layer 324 and the source/drain cap layer 334 may be formed of W, Co, Ni, Ru, Ti, Ta, TiN, TaN, combinations thereof, and/or other suitable compositions. In some instances, the gate cap layer 324 and the source/drain cap layer 334 may be formed at a temperature between about 300° C. and about 400° C., under a pressure between about 1 Torr and about 10 Torr. In some implementations, the gate cap layer 324 and the source/drain cap layer 334 may be formed to a thickness between about 3 nm and about 30 nm.

In some embodiments, the first spacer 310, the second spacer 312, the liner 314, the first SAC dielectric layer 316, the second SAC dielectric layer 318 may include a dielectric material such as silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or a combination thereof. They can be formed using CVD, ALD, plasma-enhanced CVD (PECVD), plasma-enhanced-ALD (PEALD), or other suitable technique. For example, when they are formed of silicon oxide, they may be formed in a temperature range between about 50° C. and about 400° C., under a pressure between about 1 Torr and about 10 Torr, using silane (SiH$_4$) and nitrous oxide (N$_2$O) as precursors. When they are formed of silicon nitride, they may be formed in a temperature range between about 250° C. and about 500° C., under a pressure between about 1 Torr and about 10 Torr, using dichlorosilane (DCS) and ammonia (NH$_3$) as precursors. When they are formed of silicon carbide, they may be formed in a temperature range between about 200° C. and about 450° C., under a pressure between about 1 Torr and about 10 Torr, using precursors having trimethylsilyl groups. When they are formed of silicon oxynitride, they may be formed in a temperature range between about 200° C. and about 450° C., under a pressure between about 1 Torr and about 10 Torr, using silane (SiH$_4$) and nitrous oxide (N$_2$O) as precursors. When they are formed of silicon oxy-carbide, they may be formed in a temperature range between about 200° C. and about 450° C., under a pressure between about 1 Torr and about 10 Torr, using Si—C containing gas reagents and oxygen containing gas reagents. When they are formed of silicon carbide nitride, they may be formed in a temperature range between about 200° C. and about 450° C., under a pressure between about 1 Torr and about 10 Torr, using Si—C containing gas reagents and nitrogen containing gas reagents. When they are formed of silicon oxy-carbide nitride, they may be formed in a temperature range between about 200° C. and about 450° C., under a pressure between about 1 Torr and about 10 Torr, using Si—C containing gas reagents and oxygen/nitrogen containing gas reagents. When they are formed of aluminum oxide/aluminum oxynitride/aluminum nitride, they may be formed in a temperature range between about 200° C. and about 400° C., under a pressure between about 1 Torr and about 10 Torr, using trimethylamine (TMA) and water as precursors. When they are formed of zirconium oxide/zirconium aluminum oxide/aluminum nitride, they may be formed in a temperature range between about 200° C. and about 400° C., under a pressure between about 1 Torr and about 10 Torr, using zirconium tetrachloride (ZrCl$_4$), trimethylamine (TMA) and water as precursors. When they are formed of amorphous silicon, they may be formed in a temperature range between about 350° C. and about 530° C., under a pressure between about 0 Torr and about 1 Torr, using silane (SiH$_4$) and disilane (Si$_2$H$_6$) as precursors. In some instances, the first spacer 310 and the second spacer 312 may be formed to a thickness between about 0.5 nm and about 15 nm.

A cross-section along the A-A' plane may extend through multiple channel regions and source/drain regions where different types of gate routing and source/drain routing are adopted. Multiple regions and features that may not be shown along the same A-A' plane are illustrated in FIG. 3 (as well as in FIGS. 4-11) for illustration purposes and such illustration does not limit the scope of the present disclosure unless otherwise expressly described. In embodiments represented in FIG. 3 (as well as in FIGS. 4-11), the cross-section goes through gate structure 320, source/drain contact structure (including, for example, the source/drain contact 332 and source/drain cap layer 334) 330, gate structure 320A, source/drain contact structure 330A, gate cut feature 320B and source/drain contact isolation feature 330B. In some instances, gate structure 320 and source/drain contact structure 330 may appear in the same plane. In some other instances, gate structure 320A and source/drain contact structure 330A may appear in the same plane. In still other instances, gate cut feature 320B and source/drain contact isolation feature 330B may appear in the same plane. When the gate replacement process is used, the gate cut feature 320B may be formed by filling in a first fill material 317 in openings such that a metal layer like metal layer 322 cannot be deposited in the openings. Similarly, the source/drain contact isolation feature 330B may be formed by filling in second fill material 319 in openings such that a source/drain contact layer cannot be deposited in the openings. As shown in FIG. 3, the gate cut feature 320B does not include any gate dielectric layer, metal layer or gate cap layer. Similarly, the source/drain contact isolation feature 330B does not include any source/drain contact or source/drain cap layer. The gate cut feature 320B separate gate structures, such as the gate structure 320A. The source/drain contact isolation feature 330B separate source/drain contact structures, such as the source/drain contact structure 330A.

Figure 4:
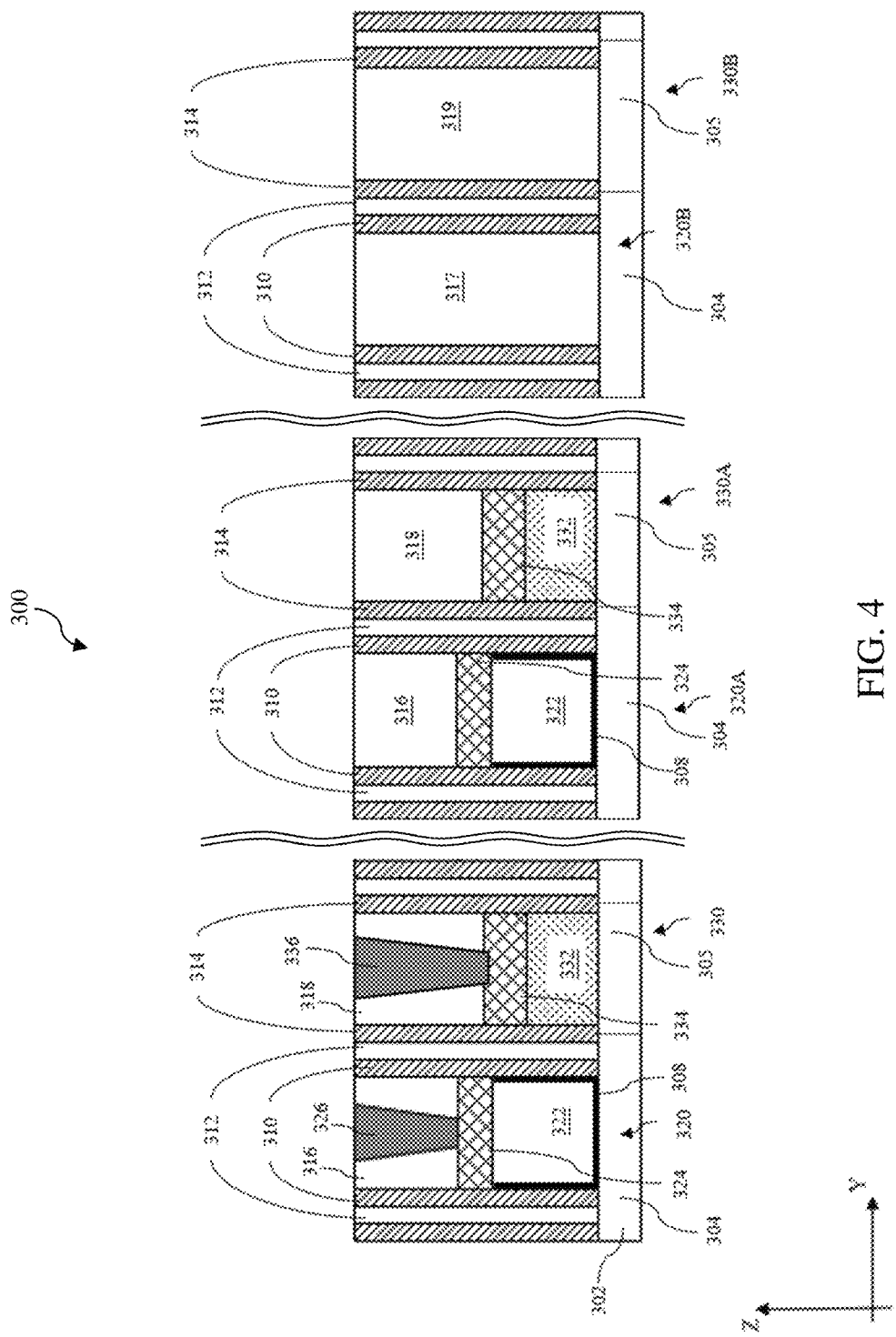

The method 200 then proceeds to block 204 where a gate contact via and a source/drain contact via are formed. For example, with reference to FIGS. 3 and 4 and in an embodiment of block 204, a gate contact via 326 is formed through the first SAC dielectric layer 316 to electrically couple to the gate cap layer 324 and a source/drain contact via 336 is formed through the second SAC dielectric layer 318 to electrically couple to the source/drain cap layer 334 using suitable lithography techniques. An example process may include forming a photoresist layer (resist) over the first SAC dielectric layer 316 and the second SAC dielectric layer 318, exposing the resist to a pattern, performing post-exposure bake processes, and developing the resist to form a masking element including the resist. With the masking element exposing regions where the via openings are to be formed, via openings may be etched through the first SAC dielectric layer 316 and the second SAC dielectric layer 318. Then conductive material may be deposited in the via openings and the masking element. Excess conductive material and a portion of the SAC layers are then removed by planarization processes, such as chemical mechanical polishing (CMP) to form a planar top surface, as shown in FIG. 4. The conductive material for the gate contact via 326 and the source/drain contact via 336 may include W, TiN, TaN, WN, Re, Ir, Ru, Mo, Al, Cu, Co, Ni, or combinations thereof.

A cross-sectional view along a plane along line A-A' may or may not extend through the gate contact via and the source/drain contact via at the same time. For example, the cross-sectional plane of the device 300 in FIG. 4 extend through the gate contact via 326 for the gate structure 320 and the source/drain contact via 336 for the source/drain contact structure 330 (including for example the source/drain contact 332 and the source/drain cap layer 334). However, in this example, the cross-sectional plane may miss the gate contact via for the gate structure 320A and the source/drain contact via for the source/drain contact structure 330A (including for example the source/drain contact 332 and the source/drain cap layer 334).

Figure 5:
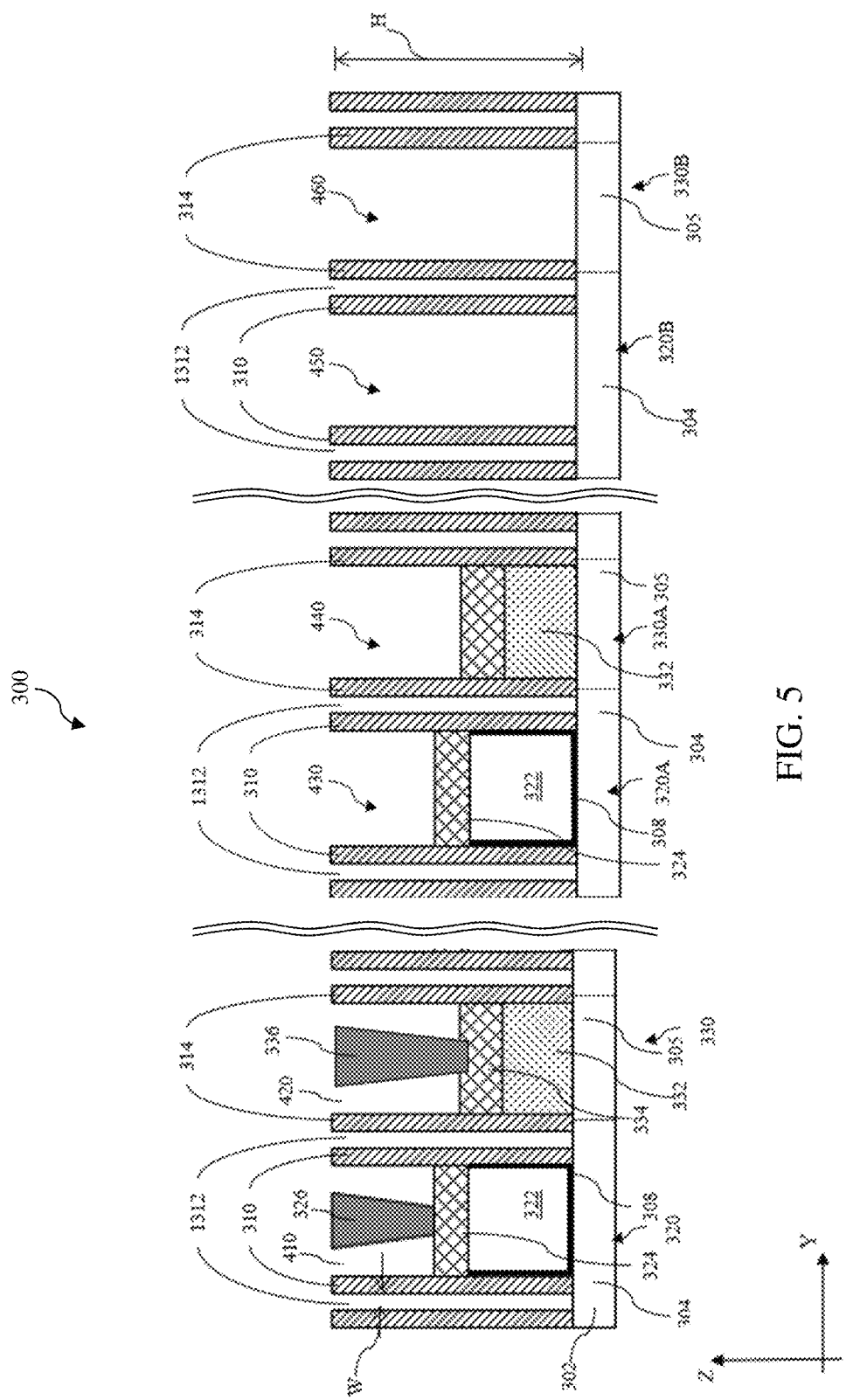

Referring to FIG. 2, after the gate contact via 326 and the source/drain contact via 336 are formed, the method 200 proceeds to block 206 where the second spacers 312 are removed to form air gaps 1312, as illustrated in FIG. 4 and FIG. 5. In some embodiments, the second spacers 312 (in FIG. 4), the first SAC dielectric layer 316, the second SAC dielectric layer 318, the first fill material 317, and the second fill material 319 are removed by etching while the first spacers 310, the liner 314, the gate contact via 326, and the source/drain contact via 336 remain substantially unetched. The removal of the second spacers 312 may be referred to as a spacer etch-back process. In some implementations, the spacer etch-back process may be performed by dry etch, wet etch or a combination thereof by taking advantage of relative etching selectivity among different materials. That is, the layers that are to be removed at block 206, including the second spacers 312 (in FIG. 4), the first SAC dielectric layer 316, the second SAC dielectric layer 318, the first fill material 317, and the second fill material 319, may be formed with material that may be preferentially removed using an etching chemistry that etches the first spacers 310, the liner 314, the gate contact via 326, and the source/drain contact via 336 at a slower rate. For example, the second spacers 312 (in FIG. 4), the first SAC dielectric layer 316, the second SAC dielectric layer 318, the first fill material 317, and the second fill material 319 may be formed of silicon oxide and the first spacers 310 and the liner 314 may be formed of silicon nitride. In this example, the dry etchant or the wet etchant used in the spacer etch-back process may be one that is more selective to silicon oxide.

In some embodiments represented in FIG. 5, opening 410, opening 420, opening 430, opening 440, opening 450, and opening 460 may be formed within the workpiece after block 206. Among them, the opening 410 surrounds the gate contact via 326, the opening 420 surrounds the source/drain contact via 336, the opening 430 is over the gate structure 320A, the opening 440 is over the source/drain contact structure 330A, the opening 450 is over the gate cut feature 320B, and the opening 460 is over the source/drain contact isolation feature 330B.

Figure 6:
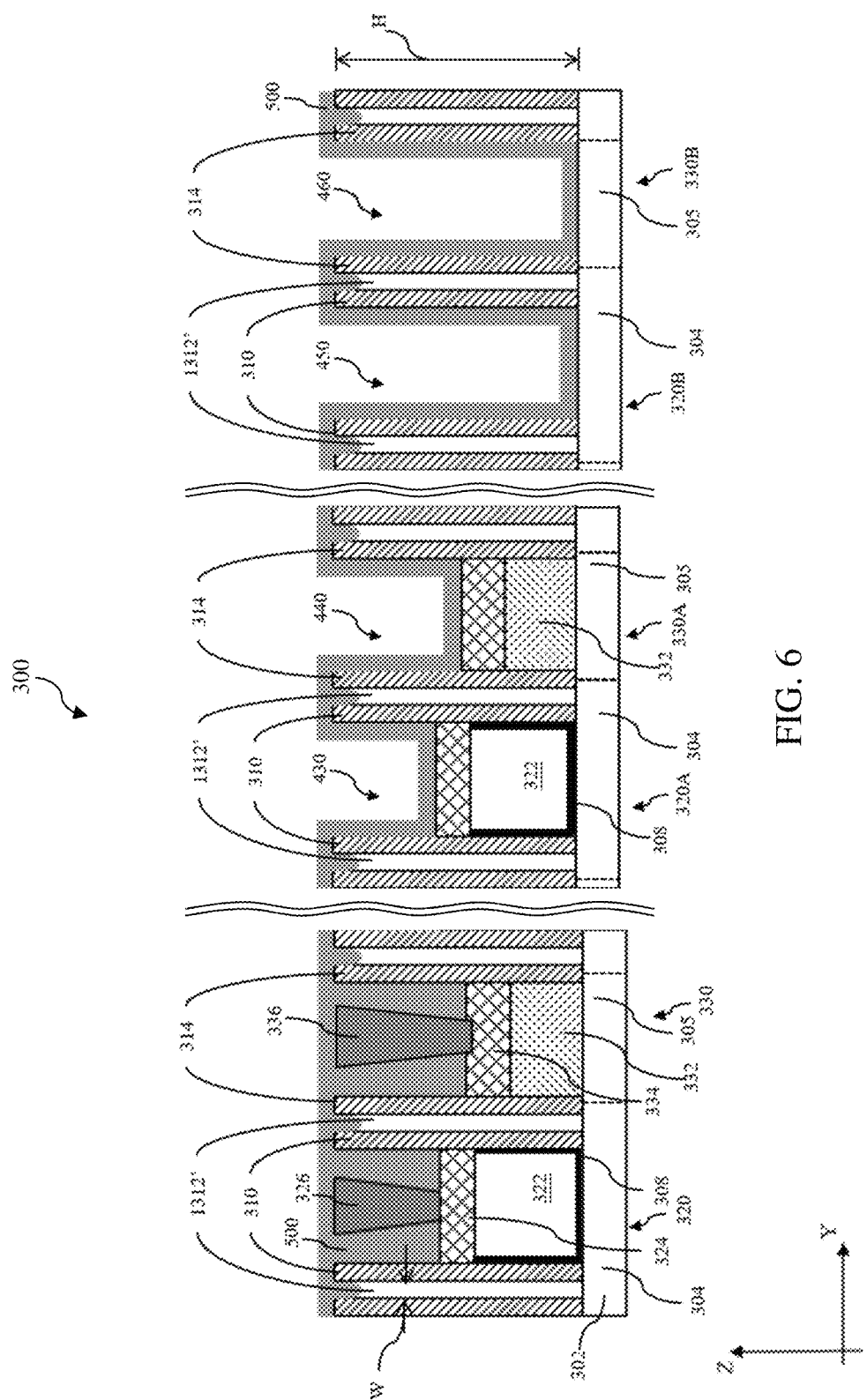

Reference is now made to FIG. 2 and FIG. 6. The method 200 proceeds to block 208 where a first sealing layer 500 is deposited over the workpiece. In some embodiments, the process to deposit the first sealing layer 500 is selected such that the first sealing layer 500 is conformal to the top surface of the workpiece of the device 300. In some implementations, the process to deposit the first sealing layer 500 is isotropic such that the first sealing layer 500 would thicken near both sides of the top opening of the air gaps 1312 (FIG. 5) and eventually plug the top opening of the air gap, leaving a plugged air gap 1312'. In some instances, the process to deposit the first sealing layer 500 may be anisotropic. As the width W of the air gap 1312 may be relatively small, such as between about 2 nm and about 4 nm, and the height of the air gap 1312 may be relatively large, such as between about 10 nm and about 50 nm, the air gap 1312 may have an aspect ratio (height over width, H/W) about 3 or more. With such ranges of aspect ratio, an anisotropic process to deposit the first sealing layer 500 may plug the top opening of the air gap 1312 without filling it. The first sealing layer 500 may include a dielectric material such as silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or a combination thereof. In some embodiments, the first sealing layer 500 may be deposited using the temperature ranges, pressure ranges and precursors described above with respect to the formation of the first spacer 310, the second spacer 312, the liner 314, the first SAC dielectric layer 316, the second SAC dielectric layer 318.

Figure 7:
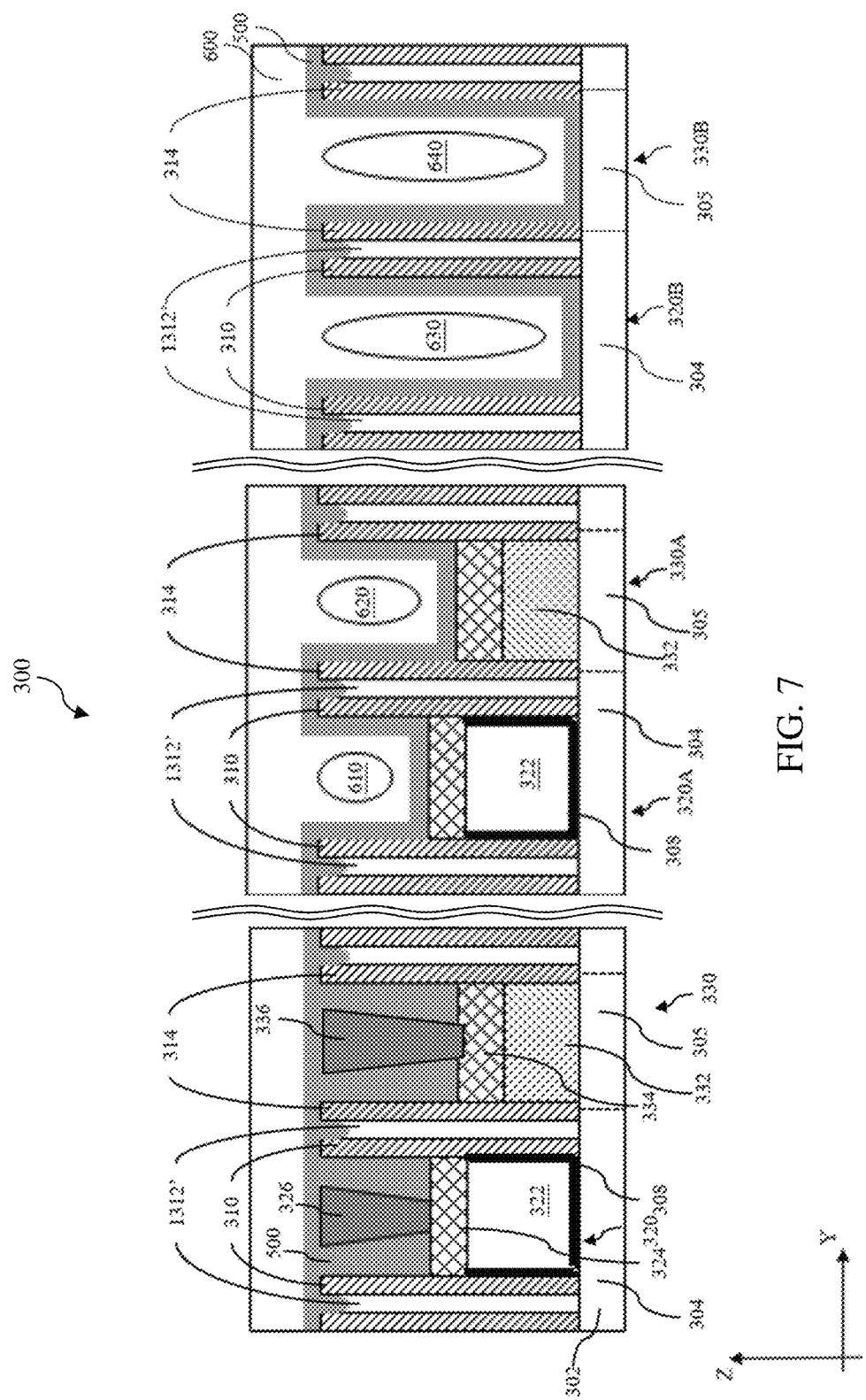

Referring now to FIG. 2 and FIG. 7, the method 200 proceeds to block 210 where a second sealing layer 600 is deposited over the first sealing layer 500. In some embodiments, a process that has limited hole-filling capability may be intentionally selected to deposit the second sealing layer 600. Example processes for the operation in block 210 may include CVD or spin coating. As illustrated in FIG. 7, because of the limited hole-filling capability of the process, air pockets 610, 620, 630, and 640 may be created at block 210. The second sealing layer 600 may include a dielectric material such as silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or a combination thereof. In some embodiments, the second sealing layer 600 may be deposited using the temperature ranges, pressure ranges and precursors described above with respect to the formation of the first spacer 310, the second spacer 312, the liner 314, the first SAC dielectric layer 316, the second SAC dielectric layer 318.

Figure 8:
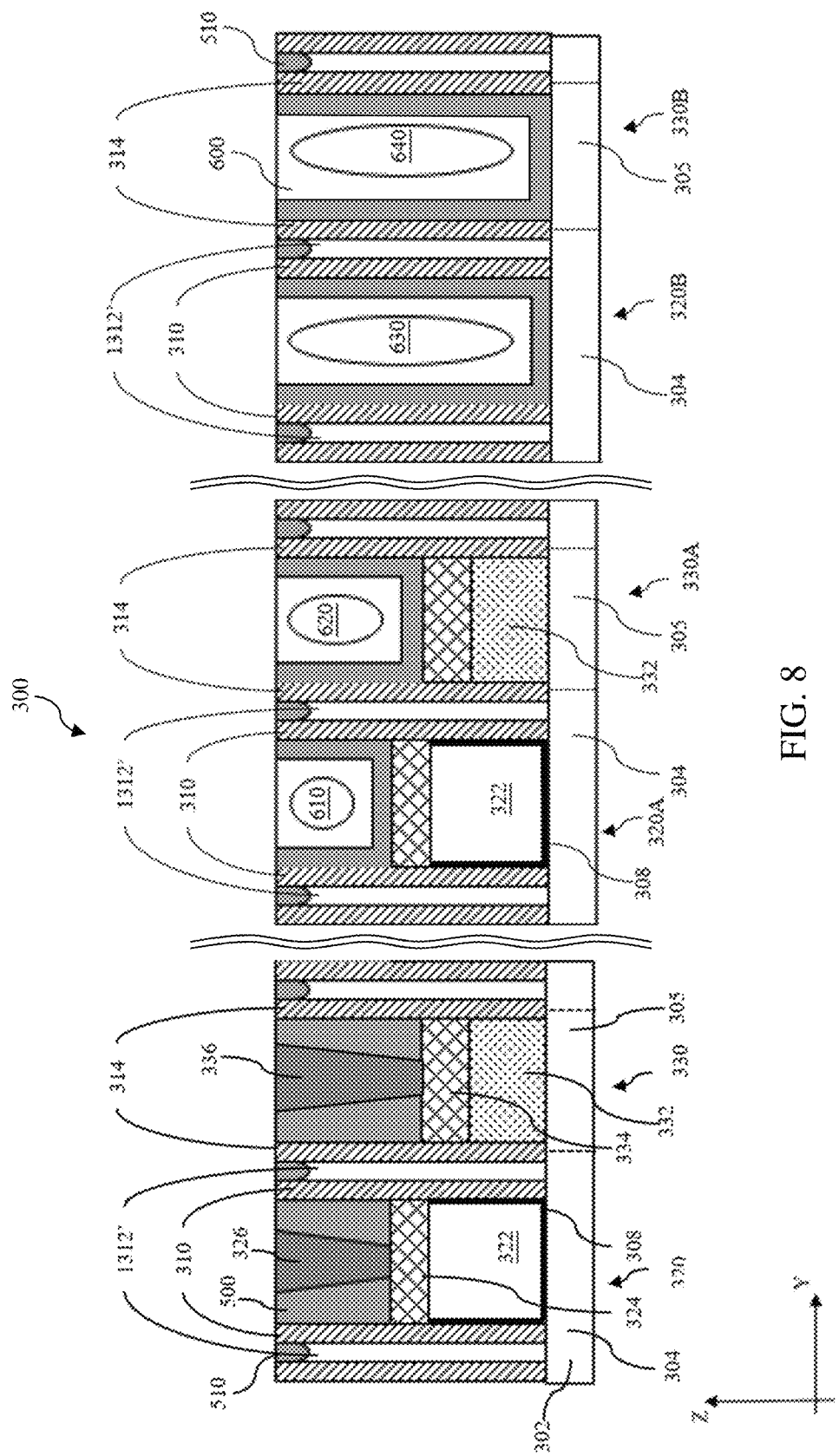

Referring now to FIG. 2 and FIG. 8, the method 200 proceeds to block 212 where a CMP process is performed on the workpiece. The CMP process planarizes a top surface of the workpiece of device 300 such that top surfaces of the first spacer 310, the liner 314, the gate contact via 326, the source/drain contact via 336, the remaining portion of the second sealing layer 600 are coplanar. The remaining portion of the second sealing layer 600 define the air pockets 610, 620, 630, and 640. In some embodiments represented in FIG. 8, after the CMP process, a plug feature 510, which is formed of the first sealing layer 500, may be formed between the first spacer 310 and the liner 314 to define an upper boundary of the plugged air gap 1312'.

Figure 10:
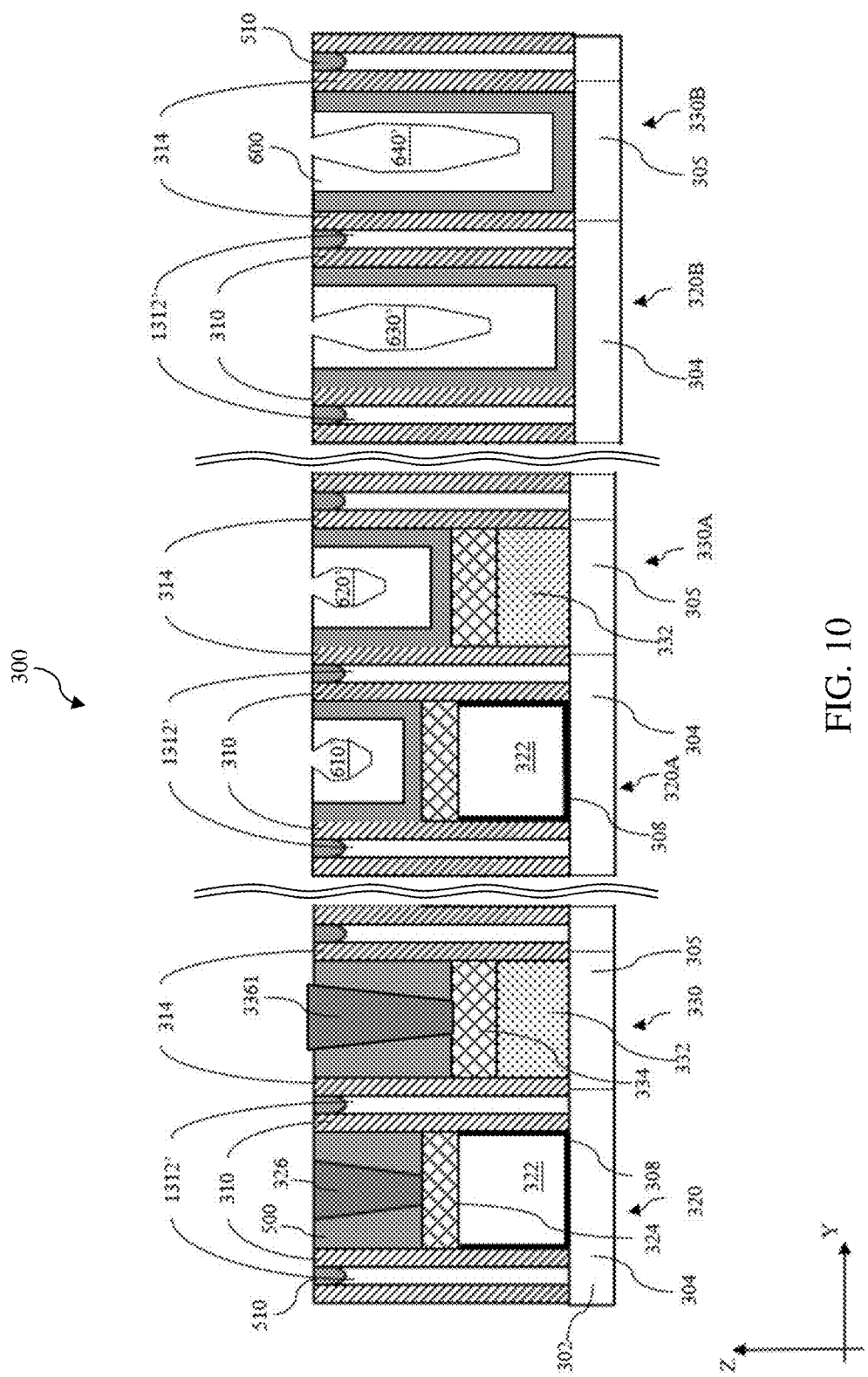
FIG. 10 provides a cross-sectional view along a plane substantially parallel to a plane defined by section A-A' of FIG. 1 of another exemplary device fabricated according to one or more steps of the method of FIG. 2.

In some alternative embodiments illustrated in FIG. 10, the gate contact via 326 and an alternative source/drain contact via 336I may be formed separately. For example, the gate contact via 326 may be formed using operations described with respect to blocks 210 and 212 and the alternative source/drain contact via 336I may then be formed using similar operations afterwards. For another example, the gate contact via 326 may be formed after the alternative source/drain contact via 336I. In these alternative embodiments, the gate contact via 326 and the alternative source/drain contact via 336I may not be coplanar and one of them may have a greater height relative to the substrate (FIG. 1) than the other.

Referring now to FIG. 2, the method 200 proceeds to block 214 where further processes are performed. For example, subsequent processing may form various multilayers interconnect features (e.g., metal layers and interlayer dielectric layers) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 9:
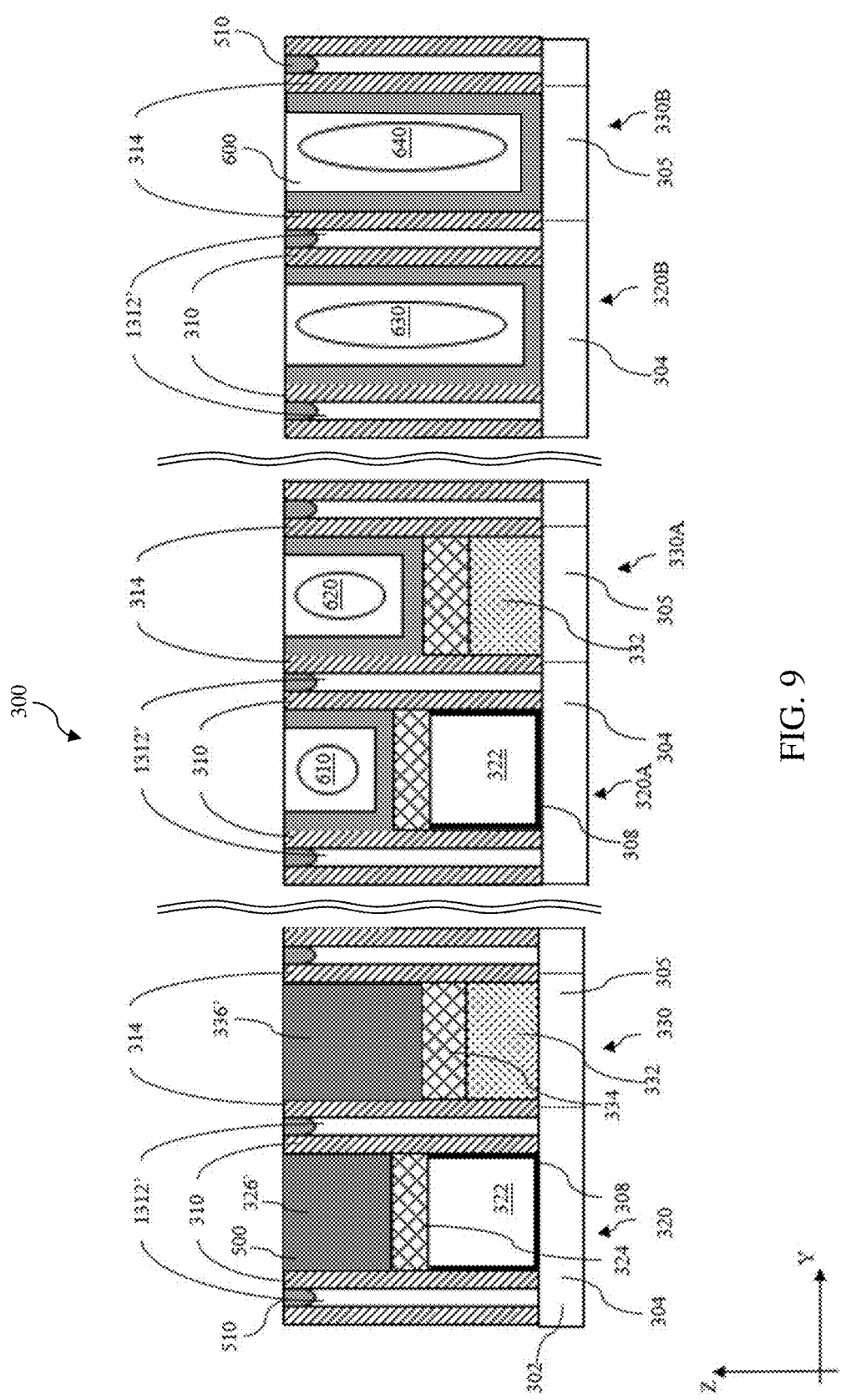
FIG. 9 provides a cross-sectional view along a plane substantially parallel to a plane defined by section A-A' of FIG. 1 of another exemplary device fabricated according to one or more steps of the method of FIG. 2.

In some embodiments, the air pockets 610, 620, 630, and 640 may be closed and completely surrounded by the second sealing layer 600, as illustrated in FIGS. 8 and 9. In those embodiments, the air pockets 610, 620, 630, and 640 are completely sealed by the second sealing layer 600. In some alternative embodiments illustrated in FIGS. 10 and 11, the air pockets 610, 620, 630, and 640 may not be completely surrounded by the second sealing layer 600 and may be referred to as open air pockets 610', 620', 630', and 640'. In these embodiments, the opening air pockets 610', 620', 630', and 640' are not completely sealed by the second sealing layer 600 and each includes an opening through top surfaces of the gate structure 320A, source/drain contact structure 330A, gate cut feature 320B, and source/drain contact feature isolation 330B, respectively. It is noted that these open air pockets 610', 620', 630', and 640', though not sealed by the second sealing layer 600, may be sealed off by an ILD layer formed at block 214.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for providing an air gap that extend not only between a gate structure and a source/drain contact, but also between a gate contact via and a source/drain contact via. The presence of the air gap may provide a reduced spacer dielectric constant, resulting in reduction of parasitic capacitance between a gate contact via and an adjacent source/drain contact via and improved speed and performance of the semiconductor device. In some embodiments, because the air gap sufficiently reduces the dielectric constant, the device 300 may be formed with a slot gate contact via 326' that is coterminous with the gate cap layer 324 along the Y direction and a slot source/drain contact via 336' that is coterminous with the source/drain cap layer 334 along the Y direction, as illustrated in FIG. 9. The wider slot gate contact via 326' and slot source/drain contact via 336' in FIG. 9 may provide additional benefits, such as further reducing the contact resistance between the gate cap layer 324 and the slot gate contact via 326', between the slot gate contact via 326' and overlying interconnect structures, between the source/drain cap layer 334 and the slot source/drain contact via 336,' and between the slot source/drain contact via 336' and the overlying interconnect structures. Additional embodiments and advantages will be evident to those skilled in the art in possession of this disclosure.

Figure 11:
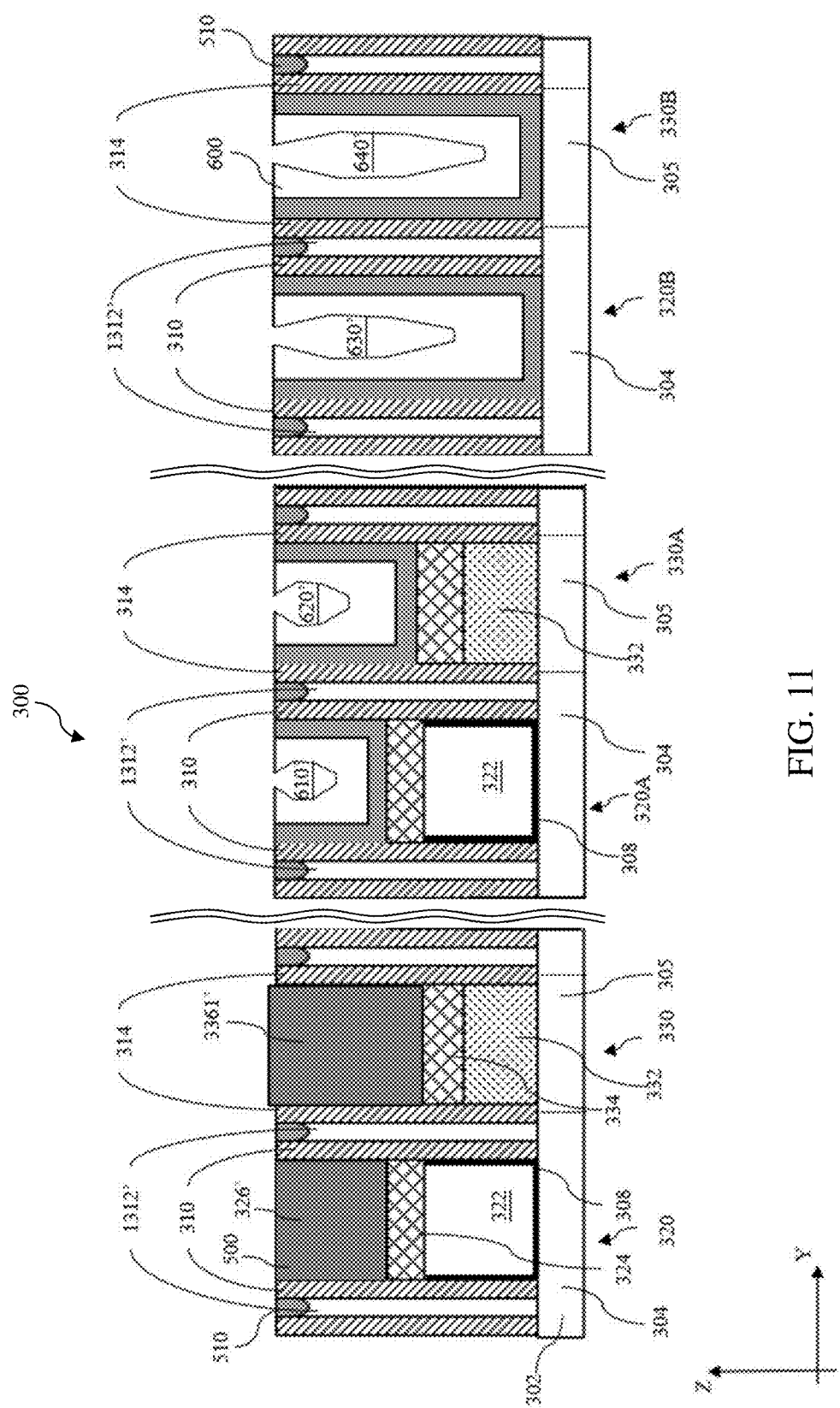
FIG. 11 provides a cross-sectional view along a plane substantially parallel to a plane defined by section A-A' of FIG. 1 of another exemplary device fabricated according to one or more steps of the method of FIG. 2.

In some alternative embodiments illustrated in FIG. 11, the slot gate contact via 326' and an alternative slot source/drain contact via 3361' may be formed separately. For example, the gate contact via 326' may be formed and the alternative slot source/drain contact via 3361' may then be formed using similar operations afterwards. For another example, the slot gate contact via 326' may be formed after the alternative slot source/drain contact via 3361'. In these alternative embodiments, the slot gate contact via 326' and the alternative slot source/drain contact via 3361' may not be coplanar and one of them may have a greater height relative to the substrate (FIG. 1) than the other.

Thus, one of the embodiments of the present disclosure provides a semiconductor device. The semiconductor device includes a fin extending from a substrate, a gate structure over a channel region of the fin, a source/drain contact over a source/drain region of the fin, a gate cut feature adjacent the gate structure, a source/drain contact isolation feature adjacent the source/drain contact, a spacer extending along a sidewall of the gate cut feature and a sidewall of the gate structure, a liner extending along a sidewall of the source/drain contact isolation feature and a sidewall of the source/drain contact; and an air gap sandwiched between the spacer and the liner. The gate cut feature and the source/drain contact isolation feature are separated by the spacer, the air gap and the liner.

In some embodiment, the gate structure and the source/drain contact are separated by the air gap. In some implementations, the semiconductor device further includes a first dielectric layer over the gate structure and the source/drain contact, a gate contact via over and electrically coupled to the gate structure, and a source/drain contact via over and electrically coupled to the source/drain contact. The gate contact via extends through the first dielectric layer over the gate structure. The source/drain contact via extends through the first dielectric layer over the source/drain contact. The gate contact via and the source/drain contact via are further separated by a portion of the first dielectric layer. In some instances, the semiconductor device further includes a plug feature over the air gap between the spacer and the liner. In some embodiments, the gate cut feature includes a first sealing layer, a second sealing layer over the first sealing layer, and an air pocket in the second sealing layer. In some implementations, the air pocket is surrounded by the second sealing layer.

In another of the embodiments, a semiconductor device of the present disclosure is provided. The semiconductor device includes a semiconductor feature having a channel region and a source/drain region adjacent to the channel region, a gate structure over the channel region, a gate contact via over and electrically coupled to the gate structure, a source/drain contact over the source/drain region, a source/drain contact via over and electrically coupled to the source/drain contact, and an air gap. The gate contact via and the source/drain contact via are separated by the air gap.

In some embodiments, the semiconductor device further includes a plurality of spacers and a plurality of liners. The semiconductor feature extends in a first direction. The gate structure is sandwiched between two of the plurality of spacers along the first direction. The source/drain contact is sandwiched between two of the plurality of liners along the first direction. In some implementations, the air gap is sandwiched between one of the plurality of spacers and one of plurality of the liners. In some instances, the gate contact via extends between the two of the plurality of spacers and the source/drain contact via extends between the two of the plurality of liners. In some embodiments, the gate contact via and the source/drain contact via are separated by one of the plurality of spacers, one of the plurality of liners, and the air gap. In some implementations, the gate structure and the source/drain contact are separated by the air gap. In some embodiments, the semiconductor device further includes a plug feature over the air gap. In some implementations, the semiconductor device further includes a first dielectric layer over the gate structure and the source/drain contact. The gate contact via extends through the first dielectric layer over the gate structure. The source/drain contact via extends through the first dielectric layer over the source/drain contact. The gate contact via and the source/drain contact via are further separated by a portion of the first dielectric layer. In some instances, the gate structure further includes a metal layer and a first cap layer over the metal layer. The semiconductor device further includes a second cap layer over the source/drain contact. A portion of the first cap layer is between the gate contact via and the metal layer and a portion of the second cap layer is between the source/drain contact via and the source/drain contact. In some examples, the first cap layer and the second cap layer each includes tungsten, cobalt, nickel, ruthenium, titanium, titanium nitride, tantalum, or tantalum nitride.

In yet another of the embodiments, a method of forming a semiconductor device is provided. The method includes receiving a workpiece that includes a substrate, a fin extending from the substrate, a gate structure over a channel region of the fin, a plurality of first spacers and a plurality of second spacers, a source/drain contact over a source/drain region of the fin, a plurality of liners. The source/drain contact is sandwiched between two of the plurality of liners and the gate structure is sandwiched between two of the plurality of first spacers. The two of the plurality of first spacers are sandwiched between two of the plurality of second spacers.

The method further includes forming a gate contact via over and electrically coupled to the gate structure, forming a source/drain contact via over the source/drain contact, and after the forming of the source/drain contact via, selectively removing the plurality of second spacers to form air gaps extending between the gate contact via and the source/drain contact via.

In some embodiments, the method further includes forming a first sealing layer over the workpiece. In some implementations, the method further includes forming a second sealing layer over the first sealing layer. In some instances, the method further includes forming a first sealing layer over the workpiece using a first deposition process and forming a second sealing layer over the first sealing layer using a second deposition process. The first deposition process is different from the second deposition process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor feature having a channel region and a source/drain region adjacent to the channel region, the semiconductor feature extending lengthwise along a first direction;
   a gate structure over the channel region;
   a first sealing layer disposed vertically and directly over the gate structure;
   a gate contact via extending through the first sealing layer to electrically couple to the gate structure, sidewalls of the gate contact via being in direct contact with the first sealing layer;
   an epitaxial source/drain feature over the source/drain region;
   a silicide layer disposed over the epitaxial source/drain feature;
   a source/drain contact over the silicide layer;
   a second sealing layer disposed vertically and directly over the source/drain contact;
   a source/drain contact via extending through the second sealing layer to electrically couple to the source/drain contact, sidewalls of the source/drain contact via being in direct contact with the second sealing layer; and
   an air gap,
   wherein the gate contact via and the source/drain contact via are separated by the air gap along the first direction.

2. The semiconductor device of claim 1, further comprising
   a plurality of spacers and a plurality of liners,
   wherein the gate structure is sandwiched between two of the plurality of spacers along the first direction,
   wherein the source/drain contact and the second sealing layer are sandwiched between two of the plurality of liners along the first direction.

3. The semiconductor device of claim 2, wherein the air gap is sandwiched between one of the plurality of spacers and one of the plurality of the liners along the first direction.

4. The semiconductor device of claim 2,
   wherein the gate contact via extends between the two of the plurality of spacers along the first direction,
   wherein the source/drain contact via extends between the two of the plurality of liners along the first direction.

5. The semiconductor device of claim 2, wherein the gate contact via and the source/drain contact via are separated by one of the plurality of spacers, one of the plurality of liners, the first sealing layer, the second sealing layer, and the air gap along the first direction.

6. The semiconductor device of claim 1,
   wherein the source/drain contact comprises cobalt,
   wherein the gate structure and the source/drain contact are separated by the air gap along the first direction.

7. The semiconductor device of claim 1, further comprising a plug feature over the air gap.

8. The semiconductor device of claim 1,
   wherein the first sealing layer and the second sealing layer comprise silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or a combination thereof.

9. The semiconductor device of claim 1,
   wherein the gate structure further comprises a metal layer and a first cap layer over the metal layer,
   wherein the semiconductor device further comprises a second cap layer directly on and in contact with the source/drain contact,
   wherein the second sealing layer is disposed directly on a top surface of the second cap layer,
   wherein a portion of the first cap layer is between the gate contact via and the metal layer and a portion of the second cap layer is between the source/drain contact via and the source/drain contact.

10. The semiconductor device of claim 9, wherein the first cap layer and the second cap layer each comprises tungsten, cobalt, nickel, ruthenium, titanium, titanium nitride, tantalum, or tantalum nitride.

11. A semiconductor device, comprising:
    a fin extending from a substrate and lengthwise along a direction, the fin comprising a channel region and a source/drain region adjacent to the channel region;
    a gate structure over the channel region;
    a gate cap layer over the gate structure;
    a first sealing layer disposed over and in contact with the gate cap layer;
    a gate contact via extending through the first sealing layer to couple to the gate cap layer, sidewalls of the gate contact via being in direct contact with the first sealing layer;
    a silicide layer disposed over the source/drain region;
    a source/drain contact over the silicide layer;
    a source/drain cap layer disposed on and in direct contact with the source/drain contact;
    a second sealing layer disposed over and in contact with the source/drain cap layer;
    a source/drain contact via extending through the second sealing layer to couple to the source/drain cap layer, sidewalls of the source/drain contact via being in direct contact with the second sealing layer;
    a spacer extending along a sidewall of the gate structure and a sidewall of the gate cap layer;
    a liner extending along a sidewall of the source/drain contact and a sidewall of the source/drain cap layer;

an air gap sandwiched between the spacer and the liner; and a plug feature over the air gap between the spacer and the liner, wherein the source/drain contact comprises cobalt, wherein the gate structure and the source/drain contact are separated by the spacer, the air gap and the liner, wherein the gate contact via and the source/drain contact via are separated by the spacer, the air gap, the first sealing layer, the second sealing layer, and the liner along the direction, wherein a top surface of the plug feature and a top surface of the gate contact via are coplanar.

12. The semiconductor device of claim 11, wherein the first sealing layer and the second sealing layer comprise silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or a combination thereof.

13. The semiconductor device of claim 11, wherein the air gap is defined by the spacer, the liner and the plug feature, wherein the spacer, the liner and the plug feature are not one continuous structure.

14. A semiconductor device, comprising:

a fin extending from a substrate, the fin comprising a channel region and a source/drain region adjacent to the channel region, the fin extending lengthwise along a direction;

a gate structure over the channel region;

a silicide layer disposed over the source/drain region;

a source/drain contact over and in contact with the silicide layer;

a first dielectric layer disposed directly over the gate structure and the source/drain contact;

a gate contact via extending through the first dielectric layer and electrically coupled to the gate structure;

a source/drain contact via extending through the first dielectric layer and electrically coupled to the source/drain contact, a spacer extending along a sidewall of the gate structure and a first sidewall of the first dielectric layer;

a liner extending along a sidewall of the source/drain contact and a second sidewall of the first dielectric layer; and an air gap sandwiched between the spacer and the liner, wherein the silicide layer comprises cobalt silicide, nickel silicide, or titanium silicide, wherein the source/drain contact comprises cobalt, wherein the gate structure and the source/drain contact are separated by the spacer, the air gap and the liner, wherein the gate contact via and the source/drain contact via are separated by the spacer, the air gap, the liner, and a portion of the first dielectric layer along the direction.

15. The semiconductor device of claim 14, further comprising a plug feature over the air gap, wherein a composition of the plug feature and a composition of the first dielectric layer are the same.

16. The semiconductor device of claim 14, further comprising:

a gate cap layer disposed between the gate contact via and the gate structure; and a source/drain cap layer disposed between the source/drain contact via and the source/drain contact.

17. The semiconductor device of claim 16, wherein the gate cap layer and the source/drain cap layer comprise tungsten (W), cobalt (Co), nickel (Ni), ruthenium (Ru), titanium (Ti), tantalum (Ta), titanium nitride (TiN), or tantalum nitride (TaN).

\* \* \* \* \*